(12) United States Patent
Strobel

(10) Patent No.: US 7,430,872 B2
(45) Date of Patent: Oct. 7, 2008

(54) NMR SPECTROMETER WITH COMMON REFRIGERATOR FOR COOLING AN NMR PROBE HEAD AND CRYOSTAT

(75) Inventor: Marco Strobel, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 365 days.

(21) Appl. No.: 11/281,442

(22) Filed: Nov. 18, 2005

(65) Prior Publication Data
US 2006/0130493 A1   Jun. 22, 2006

(30) Foreign Application Priority Data
Dec. 17, 2004   (DE)   ................... 10 2004 060 832

(51) Int. Cl.
*F25B 19/00*   (2006.01)
*F25B 19/02*   (2006.01)
*F25D 23/12*   (2006.01)

(52) U.S. Cl. ................... 62/51.1; 62/259.2; 62/51.2

(58) Field of Classification Search ................... 62/51.1, 62/259.2, 51.2, 6
See application file for complete search history.

(56) References Cited

U.S. PATENT DOCUMENTS

| | | | | |
|---|---|---|---|---|
| 4,510,771 A | * | 4/1985 | Matsuda et al. | ............... 62/51.1 |
| 4,766,741 A | * | 8/1988 | Bartlett et al. | ................ 62/51.2 |
| 5,247,256 A | * | 9/1993 | Marek | .......................... 324/321 |
| 5,247,259 A | * | 9/1993 | Miller et al. | ................. 324/540 |
| 5,508,613 A | * | 4/1996 | Kotsubo et al. | ............. 324/318 |
| 6,389,821 B2 | | 5/2002 | Strobel | |

FOREIGN PATENT DOCUMENTS

| | | |
|---|---|---|
| EP | 1 560 035 | 8/2005 |
| WO | WO 03/023433 | 3/2003 |

* cited by examiner

*Primary Examiner*—William C Doerrler
(74) *Attorney, Agent, or Firm*—Paul Vincent

(57) ABSTRACT

An NMR apparatus comprising a superconducting magnet coil system, in particular, an NMR spectrometer, with a cryostat which comprises an outer shell and a helium tank which contains the magnet coil system, and with an NMR probe head which is disposed in a room temperature bore of the cryostat and which contains a cooled RF resonator for receiving NMR signals from a sample to be examined and is cooled, together with the NMR probe head, by a cold head of a common, multi-stage, compressor-operated refrigerator, is characterized in that the cold head of the refrigerator is disposed in a neck tube, the upper end of which is connected to the outer shell of the cryostat and the lower end of which is connected to the helium tank in such a manner that the neck tube and the helium tank delimit a helium space, with at least one cooling circuit with thermally insulated transfer lines being provided between the helium space and the NMR probe head, wherein the cryogenic helium in the helium space is used as coolant for the cooling circuit. This produces an NMR apparatus which cools a plurality of elements at different temperature levels using only one single cryocooler to optimally utilize the cooling resources of the refrigerator.

15 Claims, 4 Drawing Sheets

NMR SPECTROMETER WITH COMMON REFRIGERATOR FOR COOLING AN NMR PROBE HEAD AND CRYOSTAT

This application claims Paris Convention priority of DE 10 2004 060 832.6 filed Dec. 17, 2004 the complete disclosure of which is hereby incorporated by reference.

BACKGROUND OF THE INVENTION

The invention concerns an NMR apparatus with a superconducting magnet coil system, in particular, an NMR spectrometer, having a cryostat comprising an outer shell and a helium tank which contains the magnet coil system, and an NMR probe head which is disposed in a room temperature bore of the cryostat, which contains a cooled RF resonator for receiving NMR signals from a sample to be investigated, and which is cooled, together with the NMR probe head, by a cold head of a common, multi-stage, compressor-operated refrigerator.

A device of this type is disclosed in WO 03/023433 A1.

The NMR probe head of an NMR spectrometer is located, together with a measuring device, in the bore of a magnet cryostat. This magnet cryostat contains a superconducting coil which generates the magnetic field required for NMR measurements. The NMR probe head as well as the magnet cryostat must be kept at very low temperatures during operation. The thermal loss caused by thermal conduction and thermal radiation is therefore a problem.

For this reason, a refrigerator is conventionally provided for cooling the NMR probe head. Heat exchangers and a transfer line from the refrigerator to the NMR probe head transport the cooling power generated by the refrigerator. The NMR probe head is supplied with coolant via pumps or compressors and the transfer lines. The cooled components of the probe head are usually at temperatures of 10 to 60 Kelvin. A Gifford-MacMahon cooler (GM) or a pulse tube cooler (PT) is e.g. used as refrigerator.

The magnet cryostat of an NMR spectrometer comprises a helium tank which contains the superconducting magnet and liquid helium (LHe, 4.2 K), one or more radiation shields surrounding the helium tank, an outer vacuum container which is subsequently referred to as the outer shell, and one or more neck tubes which connect the helium tank to the outer shell. The radiation shields may also be containers which are filled with liquid nitrogen (77.3 K) to reduce the heat input into the helium tank. Helium and nitrogen are evaporated by the heat input into the helium tank and on the radiation shield due to radiation and thermal conduction through the neck tubes and further suspension means. To prevent evaporation of expensive helium and nitrogen, refrigerators (PT or GM coolers) are also used to cool the magnet cryostats.

In most cases, a cold finger is installed directly in the magnet cryostat. The cold finger is thereby connected to one or more shields in the cryostat and/or condenses evaporated helium (GHe) in the helium tank. This method is more efficient due to direct cooling compared to cooling using an external refrigerator and transport of the coolant via a transfer line. Such an arrangement with direct cooling is described in U.S. Pat. No. 6,389,821. In this method, more helium is condensed than evaporated. For this reason, part of the cooling power must be compensated for by an electric heating means. Part of the cooling power is thereby wasted.

WO 03/023433 A1 proposes use of a refrigerator cold finger which is installed in the magnet cryostat not only for cooling the cryostat but also for simultaneously cooling the NMR probe head. A large part of the transfer lines thereby extends within the cryostat which bears the risk that the occasionally required cleaning of the soiled NMR probe head could result in heat input into the magnet coil system and quenching of the magnet coil.

One would like to cool the NMR probe head and the magnet cryostat in a manner which is as simple and efficient as possible using a maximum amount of the cooling power produced by the refrigerator. This means that e.g. a thermal load at 60 Kelvin should not be cooled by a cooling source at 10K, since the efficiency would be very poor. Two-stage cryocoolers are therefore particularly suited for cooling elements at different temperatures, since cooling power can be tapped at two different temperature levels. The two temperature levels provided by the cryocooler are sufficient for cooling a helium tank and a radiation shield. Cooling of the NMR probe head, however, requires two additional temperature levels to cool the pre-amplifier and the resonator. The method described in WO 03/023433 A1 cannot optimize cooling, since it is not possible to use temperatures between the two temperature levels of the pulse tube cooler. Optimum cooling operation is therefore generally not possible with such devices. In the conventional devices, a considerable part of the input power of the cooler, approximately 4-8 kW, is still lost.

It is therefore the underlying purpose of the invention to propose an NMR arrangement wherein the probe head and magnet cryostat are cooled by a common refrigerator, permitting optimum utilization of the cooling resources of the refrigerator.

SUMMARY OF THE INVENTION

This object is achieved in accordance with the invention in that the cold head of the refrigerator is disposed in a neck tube, the upper end of which is connected to the outer shell of the cryostat and the lower end of which is connected to the helium tank in such a manner that the neck tube and the helium tank delimit a helium space, and with at least one cooling circuit comprising thermally insulated transfer lines disposed between the helium space and the NMR probe head, wherein the cryogenic helium provided in the helium space serves as coolant for the cooling circuit.

In this manner, no additional coolant is required for the cooling circuit of this arrangement. Since the temperature of the helium differs in dependence on its position within the helium tank, it is fundamentally possible with the inventive arrangement to remove helium at different temperature levels for the cooling circuit/s. The inventive arrangement can optimally meet the various temperature level requirements of the objects to be cooled, thereby improving the efficiency. Moreover, in the inventive arrangement, the helium space and the surface of the cold head assume the role of a heat exchanger. A plurality of heat exchangers can be omitted, whose installation directly in the magnet cryostat would otherwise cause considerable problems and additional thermal loss. Moreover, the inventive construction eliminates the risk of clogging transfer lines, which has been a problem with NMR probe heads. In the inventive arrangement, deposits remain in the helium space and do not soil the transfer line.

The transfer lines of the cooling circuit advantageously extend at least partially outside of the cryostat. This facilitates maintenance.

In an advantageous embodiment of the inventive arrangement, the cooling circuit comprises a heat exchanger and a pump outside of the cryostat. The pump is used for circulating and thereby returning the coolant to the helium tank. The coolant initially accepts heat in the heat exchanger which it returns to the heat exchanger after passage through the pump. This ensures circulation of the coolant using a conventional pump with only minimum power loss.

In a particularly preferred embodiment of the invention, the transfer lines comprise a common thermally insulated line section and the transfer line at the lowest temperature level is thermally shielded by at least one radiation shield which is at a higher temperature level. A transfer line with a higher temperature level may e.g. be used as radiation shield. The transfer line with the lowest temperature level is thereby exposed to a reduced temperature difference, which decreases the energy loss and the requirements for insulation of the line section.

In a particularly advantageous manner, the transfer lines are disposed coaxially. The transfer line with the lowest temperature level is advantageously disposed in the center of the arrangement.

In a particularly preferred embodiment of the arrangement, the transfer lines each have at least one opening in the helium space, wherein the openings of the transfer lines are at different temperature levels.

The transfer line with the lower temperature level supplies coolant to the NMR probe head. The position of the opening of this transfer line (lower opening) determines the temperature of the coolant discharged from the helium space. After heating in the NMR probe head and passage through the above-described heat exchanger and pump, the gas is returned through the opening of the transfer line with the higher temperature level (upper opening) into the gas space. The temperature at the level of the upper opening should correspond approximately to that of the supplied gas. The gas flow between the openings is cooled along the cold head, thereby utilizing the capacity of the cold head to accept energy even at temperature levels between those of the two cooling stages. The adaptability of the temperature due to the position of the openings and cooling along the cold head permit optimum adjustment of the performance of the cold head to the components being cooled.

With particular advantage, the transfer lines are detachably mounted, in particular, plugged into the neck tube. In this manner, the transfer lines can be easily introduced into or removed from the helium space and be heated without transferring heat to the magnet cryostat, which could otherwise cause a quench or evaporation of a considerable amount of coolant. In a particularly preferred embodiment of the NMR arrangement, the transfer lines can be displaced in the direction of the neck tube axis. This permits selection of the temperature level.

In particular, for cooling an NMR probe head, two cooling circuits with different temperature levels are advantageously provided, wherein the cooling circuit with the higher temperature level is provided for cooling a pre-amplifier of the NMR probe head and the cooling circuit with the lower temperature level is provided for cooling the resonator.

The common refrigerator is advantageously a pulse tube cooler. Pulse tube coolers operate with extremely low vibration and therefore generate only minimum disturbances in the sample volume.

In a special embodiment of the invention, the helium tank contains a thermal barrier with a Joule-Thomson valve. In this Joule-Thomson valve, the helium in the helium tank is further cooled due to adiabatic relaxation and is partially liquefied. With this arrangement, more power can be supplied to the NMR probe head, since e.g. the temperature of the second stage of the cold head can be increased due to the thermal barrier without influencing the helium bath temperature (4.2 K). It is also possible to reduce the temperature in the helium bath and at the same time maintain power for the NMR probe head. The effectivity of the overall system is thereby considerably improved.

Moreover, it may be advantageous for the refrigerator compressor to also drive at least one of the cooling circuits. No further compressor is required in this case.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

Figure 1:
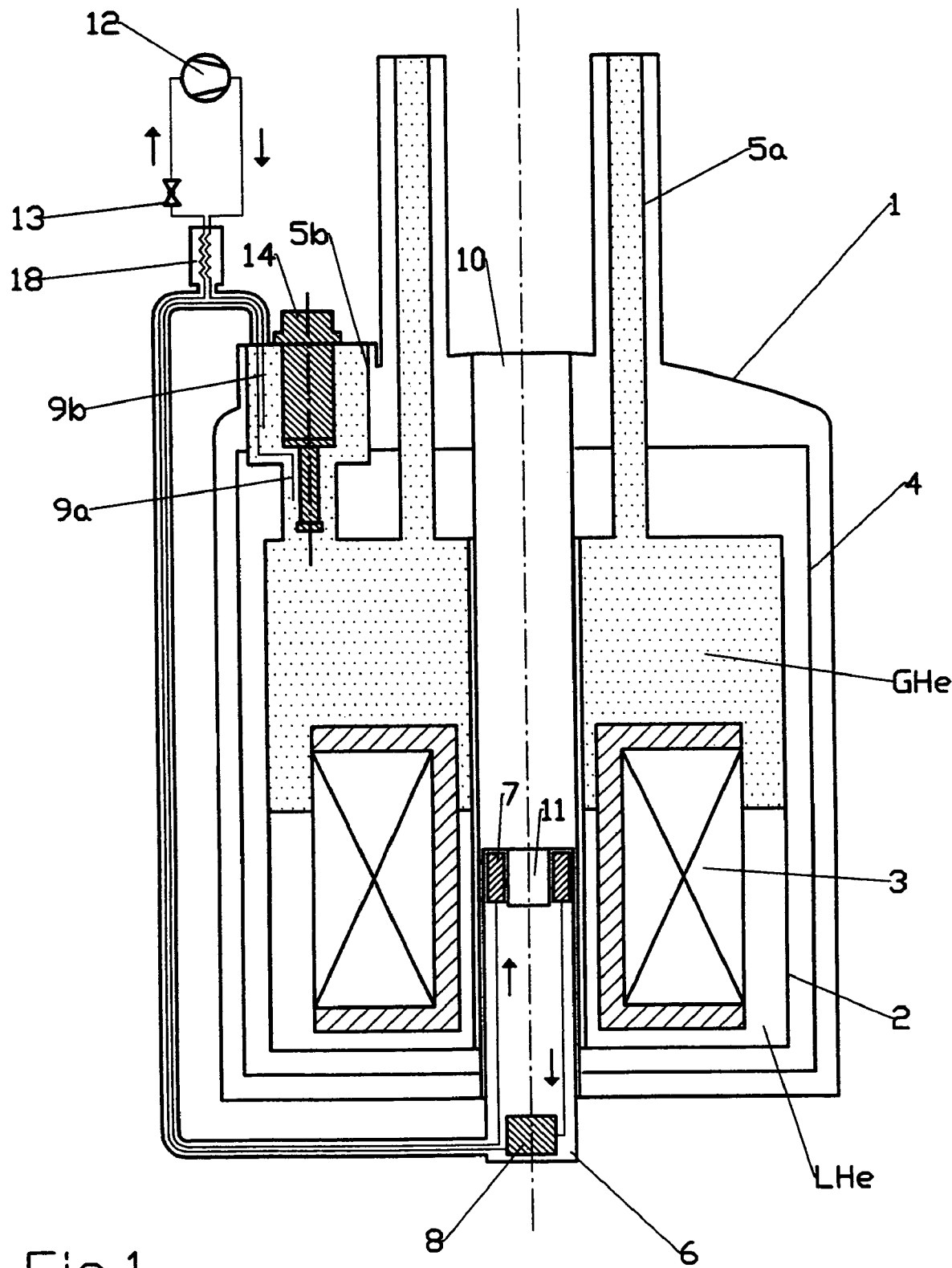
FIG. 1 shows a schematic view of an embodiment of the inventive arrangement.

The essential components of the cryostat are an outer shell 1, a helium tank 2 which contains a superconducting magnet coil system 3 and liquid helium, a radiation shield 4 and one or more neck tubes 5a which connect the helium tank 2 to the outer shell 1.

The NMR spectrometer comprises an NMR probe head 6 with a resonator 7 and a pre-amplifier 8. The coolant is transported through vacuum-insulated transfer lines 9a, 9b. The NMR probe head 6 is disposed in a room temperature bore 10 of the magnet cryostat. During an NMR measurement, the sample to be examined is in the sample volume 11 which is surrounded by the resonator 7. The NMR probe head 2 may be connected in many different ways (see U.S. Pat. No. 5,889, 456). In all present variants, the simplest connections are used.

In the embodiment of the inventive NMR spectrometer shown in FIG. 1, the NMR probe head 6 is cooled using a cooling circuit in which a pump 12 or a compressor drives the coolant flow through the transfer lines 9a, 9b. The transfer line 9a for the advance flow and the transfer line 9b for the return flow of the coolant to or from the NMR probe head 6 extend within a common line section. In this manner, the transfer line 9b which is at a lower temperature level than the transfer line 9a, can shield the transfer line 9a. The flow rate of the cooling circuit is controlled by a control valve 13. A cold head 14 is disposed in a neck tube 5a cooling the radiation shield 4 and the helium in the helium tank 2.

Figure 2:
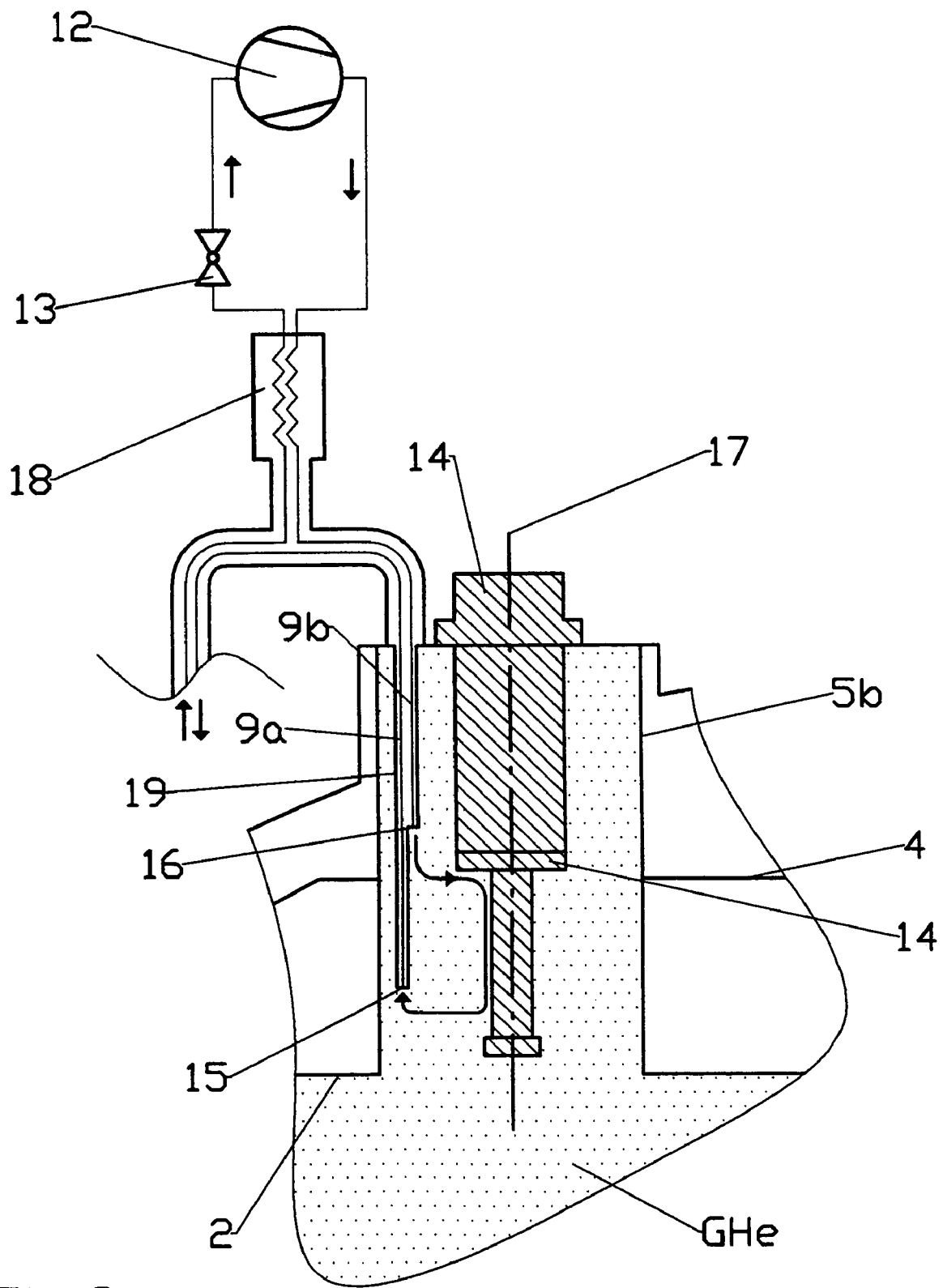
FIG. 2 shows a schematic view of a section of the inventive arrangement shown in FIG. 1.

FIG. 2 shows a section of the inventive arrangement in the region of the neck tube 5b of the magnet cryostat. The transfer lines 9a, 9b project into the helium space in the neck tube 5b and have two openings 15, 16 which are at different temperature levels. The different temperature levels are realized by different positions of the openings 15, 16 in the transfer lines 9a, 9b relative to the axis 17 of the neck tube 5b. For cooling the NMR probe head 6, cold helium enters the lower opening 15 of the transfer line 9a. After passage through the transfer line 9a, the helium is heated in the resonator 7 and subsequently in the pre-amplifier 8 to approximately 70 to 90 K, and cools the resonator 7 to approximately 6 to 20 K and the pre-amplifier 8 to approximately 70 K. The coolant is returned through the transfer line 9b and heated in a heat exchanger 18 to just below ambient temperature (approximately 290 K). The warm helium is compressed in the pump 12 after passage through the control valve 13 and is returned to the heat exchanger 18 where it is cooled and fed, via the transfer line 9b, at the upper opening 16 into the helium space. After entry into the helium space, the returned helium is mixed with the helium in the helium tank 2 and is cooled at the cold head 14 on its passage to the lower opening 15.

Figure 3:
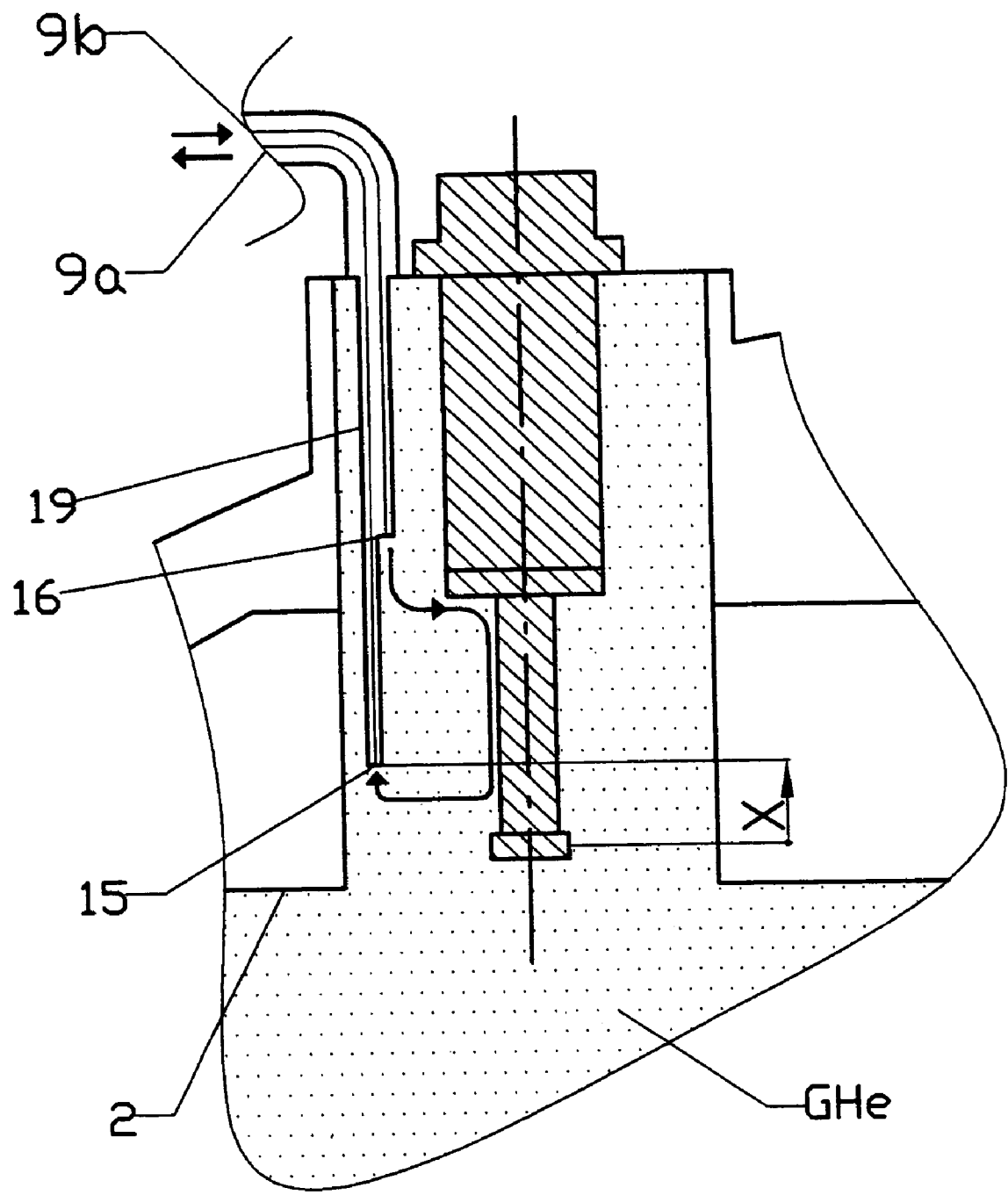
FIG. 3 shows a further schematic view of a section of the inventive arrangement shown in FIG. 1 to illustrate the adjustment of the temperature level.

The requirements for the temperature levels of the components to be cooled may vary in dependence on the NMR application. The inventive arrangement permits almost arbitrary selection of the temperature of the coolant guided in the transfer lines 9a, 9b in a range between the temperature of the returned helium and 4.2 K of the liquid helium in the helium tank 2 through providing displaceable transfer lines 9a, 9b and a coolant reservoir with continuous temperature transfer. The transfer lines 9a, 9b are generally connected to each other and have a common end piece 19. The desired temperature level is adjusted through displacing the end piece 19 of the transfer lines 9a, 9b and thereby of the openings 15, 16 along the axis 17 of the neck tube 5b to a position X which is schematically shown in FIG. 3. The transfer lines 9a, 9b are constructed in such a manner that they can be easily removed from the neck tube region to facilitate cleaning of the transfer lines 9a, 9b or the NMR probe head 6 without influencing the cooling process of the cryostat.

Figure 4:
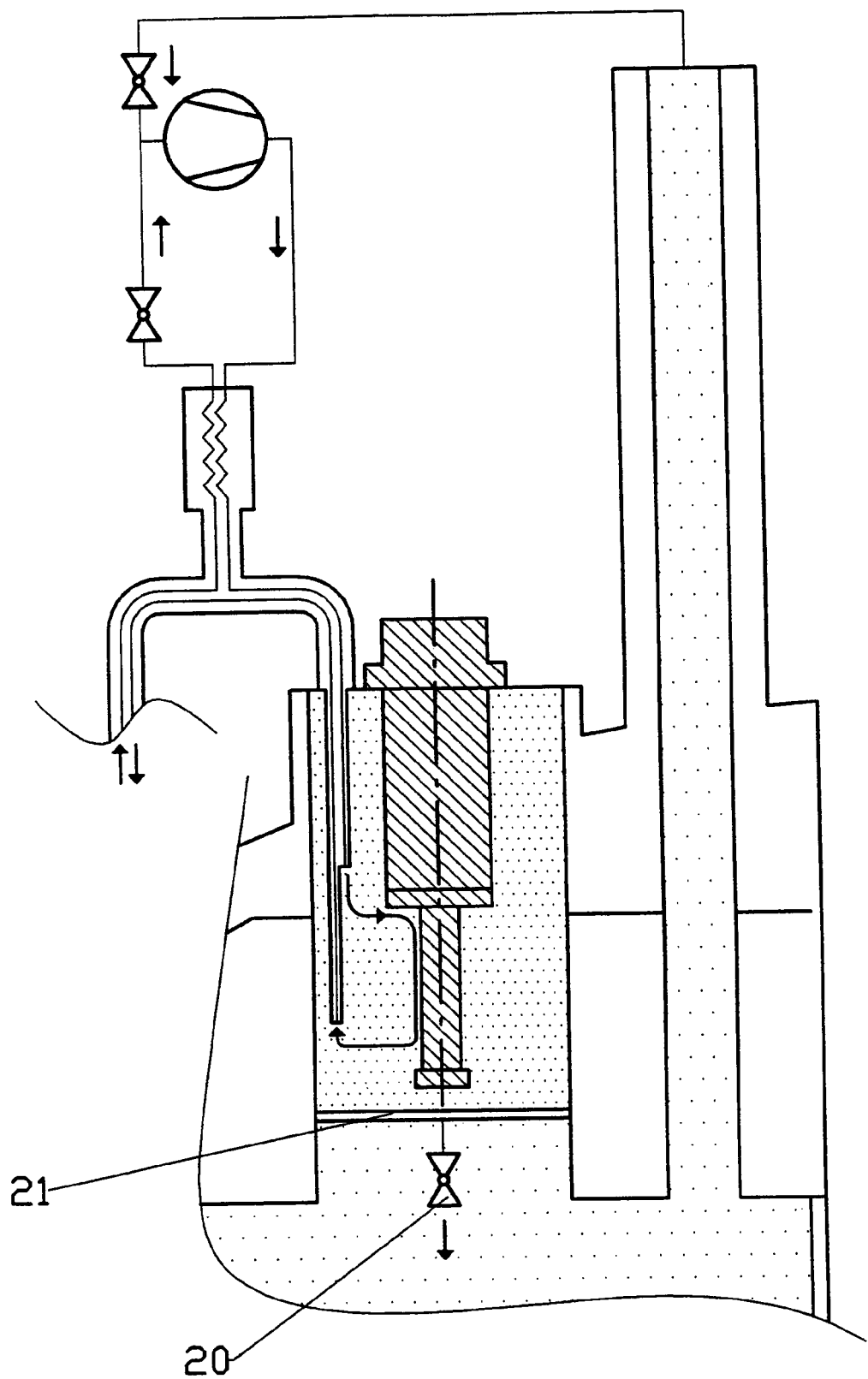
FIG. 4 shows a schematic view of a detailed section of the inventive arrangement of FIG. 1 with JT valve and thermal barrier in the neck tube.

FIG. 4 shows an inventive arrangement which permits shifting of the power temperatures using a Joule-Thomson valve 20 integrated in the helium space, and a thermal barrier 21. Due to expansion of the helium gas by the Joule-Thomson valve 20, additional heat is withdrawn from the helium in the helium tank 2 thereby increasing the cooling power of the cooling circuit. Due to the cooling power obtained in this manner, more power can be supplied to the cooling circuit of the NMR probe head 6. It is also possible to reduce the temperature in the helium tank 2 and at the same time maintain the power for the NMR probe head. 6.

One obtains an overall maintenance-friendly NMR apparatus which realizes efficient cooling of a plurality of elements with different temperature levels using only one single refrigerator. Due to the flexibility of the arrangement with respect to the available temperature levels which can be optimizied to have the required cooling temperatures, the cooling power of the refrigerator is utilized in a highly effective manner, thereby improving the efficiency.

LIST OF REFERENCE NUMERALS 1 outer shell
2 helium tank
3 magnet coil system
4 radiation shield
5a neck tube (magnet system)
5b neck tube (cold head)
6 NMR probe head
7 resonator
8 pre-amplifier
9a transfer line (advance flow)
9b transfer line (return flow)
10 room temperature bore
11 sample volume
12 pump
13 control valve
14 cold head
15 lower opening
16 upper opening
17 axis of the neck tube
18 heat exchanger
19 end piece of the transfer line
20 Joule-Thomson valve
21 thermal barrier

I claim:

1. An NMR apparatus for analysis of a sample, the apparatus comprising:
    a cryostat having an outer shell, a room temperature bore, a helium tank, and a neck tube, said neck tube having an upper end connected to said outer shell and a lower end connected to said helium tank, wherein said neck tube and said helium tank delimit a helium space;
    a superconducting magnet coil system disposed in said helium tank;
    an NMR probe head disposed in said room temperature bore, said probe head having a cooled RF resonator for receiving NMR signals from the sample;
    a common, multi-stage, compressor-operated refrigerator having a cold head, wherein said cold head is disposed in said neck tube; and
    at least one cooling circuit having thermally insulated transfer lines, said cooling circuit extending between said helium space and said NMR probe head to cool said probe head and said RF resonator using cold helium gas from said helium space, said cooling circuit having a feed line extending from said helium space to said probe head within said transfer line, a return line extending from said probe head to said helium space within said transfer line, and a pump disposed within said return line, said feed line having an end opening disposed at a first vertical position within said neck tube, said return line having an end opening disposed at a second vertical position within said neck tube which is higher than said first vertical position, wherein helium gas is transported from said pump to exit from said end opening of said return tube and pass downwardly along said refrigerator within said helium space, wherein cold helium gas enters from said helium space into said end opening of said feed line to pass through said feed line to said probe head, and warmed helium gas passes from said probe head to said pump via said return line.

2. The NMR apparatus of claim 1, wherein said transfer lines of said cooling circuit extend at least partially outside of said cryostat.

3. The NMR apparatus of claim 2, wherein cooling circuit portions outside of said cryostat comprise a heat exchanger.

4. The NMR apparatus of claim 1, wherein said transfer lines comprise a common, thermally insulated line section, wherein a transfer line having a lowest temperature level is thermally shielded by at least one radiation shield at a higher temperature level.

5. The NMR apparatus of claim 1, wherein said transfer lines are disposed coaxially.

6. The NMR apparatus of claim 1, wherein said end opening of said return line and said end opening of said feed line are at different temperature levels.

7. The NMR apparatus of claim 6, wherein said transfer lines are detachably mounted.

8. The NMR apparatus of claim 7, wherein said transfer lines are plugged into said neck tube.

9. The NMR apparatus of claim 6, wherein said transfer lines can be displaced in a direction of an axis of said neck tube.

10. The NMR apparatus of claim 1, wherein two of said at least one cooling circuit have different temperature levels, wherein a cooling circuit with a higher temperature level cools a pre-amplifier of said NMR probe head and a cooling circuit with a lower temperature level cools said resonator.

11. The NMR apparatus of claim 1, wherein said common refrigerator is a pulse tube cooler.

12. The NMR apparatus of claim 1, further comprising a thermal barrier having a Joule-Thomson valve disposed in said helium tank.

13. The NMR apparatus of claim 1, wherein said refrigerator compressor additionally drives at least one of said cooling circuits.

14. The NMR apparatus of claim 1, wherein the NMR apparatus is an NMR spectrometer.

15. The NMR apparatus of claim 1, wherein the NMR apparatus is an MRI (Magnetic Resonance Imaging) apparatus.

* * * * *